(12) United States Patent
Yamawaki et al.

(10) Patent No.: US 6,639,933 B2
(45) Date of Patent: Oct. 28, 2003

(54) PHASE-LOCKED LOOP CIRCUIT AND RADIO COMMUNICATION APPARATUS USING THE SAME

(75) Inventors: Taizo Yamawaki, Kokubunji (JP); Masaru Kokubo, Hanno (JP); Tomio Furuya, Gunma-ken (JP); Kazuo Watanabe, Takasaki (JP); Julian Hildersley, Royston (GB)

(73) Assignees: Hitachi. Ltd., Tokyo (JP); The Technology Partnership PLC, Hertfordshire (GB)

( * ) Notice: Subject to any disclaimer, the term of this patent is extended or adjusted under 35 U.S.C. 154(b) by 0 days.

(21) Appl. No.: 09/993,764

(22) Filed: Nov. 27, 2001

(65) Prior Publication Data

US 2002/0044621 A1 Apr. 18, 2002

Related U.S. Application Data

(63) Continuation of application No. 09/729,721, filed on Dec. 6, 2000, now Pat. No. 6,324,219, which is a continuation of application No. 09/016,302, filed on Jan. 30, 1998, now Pat. No. 6,163,585.

(30) Foreign Application Priority Data

Jan. 30, 1997 (JP) .............................................. 9-017217

(51) Int. Cl.[7] .............................. H03D 3/24; H04L 5/16; H04L 27/04; H04L 25/03

(52) U.S. Cl. ...................... 373/376; 375/219; 375/295; 375/297

(58) Field of Search ................................. 375/373, 376, 375/219, 316, 295, 297, 375; 455/73, 75, 76, 85, 86, 123, 91; 327/142, 143, 156, 66, 132, 490, 135

(56) References Cited

U.S. PATENT DOCUMENTS

| 4,562,410 A | 12/1985 | O'Rourke ................... 331/1 A |
| 4,714,900 A | 12/1987 | Sata ............................... 331/8 |

(List continued on next page.)

FOREIGN PATENT DOCUMENTS

| EP | 0410029 | 1/1991 |
| EP | 0519562 | 12/1992 |
| GB | 2261345 | 5/1993 |

OTHER PUBLICATIONS

D. Turner, "Phase–Locked Loop Phase Adjustment", *IBM Technical Disclosure Bulletin*, vol. 15, No. 7, Dec. 1972, pp. 2080–2081.

(List continued on next page.)

*Primary Examiner*—Tesfaldet Bocure
(74) *Attorney, Agent, or Firm*—Antonelli, Terry, Stout & Kraus, LLP

(57) ABSTRACT

A communication apparatus includes a phase-locked loop circuit which receives a first signal having a frequency and converts it into an output signal having a transmission frequency, and includes a current output type phase comparator which converts a phase difference between the first signal and a second signal into a current signal, a low pass filter which filters the current signal of the current output type phase comparator to produce an output signal, a voltage controlled oscillator which produces an output signal having a transmission frequency corresponding to the output signal of the low pass filter, the output signal of the voltage controlled oscillator constituting the output signal of the phase-locked loop circuit, a frequency converter which frequency-converts the output signal of the voltage controlled oscillator to produce the second signal, and a current source which supplies a current to an input of the low pass filter.

20 Claims, 9 Drawing Sheets

U.S. PATENT DOCUMENTS

| | | | | |
|---|---|---|---|---|
| 4,745,372 A | | 5/1988 | Miwa | 331/8 |
| 4,835,610 A | * | 5/1989 | Dieterle et al. | 348/542 |
| 4,890,072 A | * | 12/1989 | Espe et al. | 331/11 |
| 4,952,889 A | | 8/1990 | Irwin et al. | 332/128 |
| 5,103,191 A | | 4/1992 | Werker | 331/1 A |
| 5,204,975 A | * | 4/1993 | Shigemori | 455/231 |
| 5,313,173 A | | 5/1994 | Lampe | 332/128 |
| 5,359,297 A | | 10/1994 | Hodel et al. | 331/1 A |
| 5,424,689 A | * | 6/1995 | Gillig et al. | 331/17 |
| 5,436,597 A | | 7/1995 | Dunlap et al. | 331/1 A |
| 5,511,236 A | | 4/1996 | Umstattd et al. | 455/76 |
| 5,566,204 A | * | 10/1996 | Kardontchik et al. | 375/219 |
| 5,610,952 A | * | 3/1997 | Yamanaka et al. | 375/371 |
| 5,635,879 A | | 6/1997 | Sutardja et al. | 331/57 |
| 5,651,035 A | * | 7/1997 | Tozun et al. | 375/373 |
| 5,825,254 A | | 10/1998 | Lee | 455/76 |
| 5,834,987 A | * | 11/1998 | Dent | 332/127 |
| 5,890,051 A | | 3/1999 | Schlang et al. | 455/76 |
| 5,909,149 A | * | 6/1999 | Bath et al. | 331/2 |
| 6,091,303 A | * | 7/2000 | Dent | 331/2 |
| 6,157,271 A | * | 12/2000 | Black et al. | 332/127 |
| 6,163,585 A | * | 12/2000 | Yamawaki et al. | 375/373 |
| 6,324,219 B2 | * | 11/2001 | Yamawaki et al. | 375/295 |
| 6,377,315 B1 | * | 4/2002 | Carr et al. | 348/726 |

OTHER PUBLICATIONS

*Phaselock Techniques*, Chapter 10.3, "Translation Loops", pp. 204–207, date unknown, John Wiley & Sons, ISBN 0–471–04294–3.

*Design Technique of Analog Integrated Circuit for Super LSI*, Last Volume, Chapters 10.3.2, 10.3.3, and 10.3.4, pp. 172–183, Baikufan, date unknown (in Japanese).

* cited by examiner

PHASE-LOCKED LOOP CIRCUIT AND RADIO COMMUNICATION APPARATUS USING THE SAME

CROSS-REFERENCE TO RELATED APPLICATIONS

This application is a continuation of application Ser. No. 09/729,721 filed on Dec. 6, 2000, now U.S. Pat. No. 6,324,219, which is a continuation of application Ser. No. 09/016,302 filed on Jan. 30, 1998, now U.S. Pat. No. 6,163,585. The contents of application Ser. Nos. 09/729,721 and 09/016,302 are hereby incorporated herein by reference in their entirety.

BACKGROUND OF THE INVENTION

The present invention relates to a phase-locked loop (hereinafter referred to PLL) for a transmission system included in a portable terminal for converting an intermediate frequency (IF) signal into a radio frequency (RF) signal mainly in the mobile communication and the portable terminal for the radio communication using the PLL.

A PLL system using a local signal frequency $f_{LO}$ to convert an input signal frequency $f_{IF}$ into an output signal frequency $F_{LO}-F_{IF}$ is described in Chapter 10.3 of "PHASELOCK TECHNIQUES" (ISBN 0-471-04294-3) published by John Wiley & Sons and is shown in FIG. 10. In FIG. 10, a phase comparator 18 compares a phase of an input signal frequency $F_{IF}$ with a phase of a reference signal frequency $f_{REF}$ and produces a signal proportional to a phase difference between the two input signals. The output signal of the phase comparator 18 is supplied to a low pass filter (LPF) 19 in which unnecessary harmonic components and noise are removed from the output signal and an output signal of the low pass filter is supplied to a VCO 20. An output frequency $f_{RF}$ of the VCO 20 is supplied through a coupler 21 to a mixer 22 to be mixed with a local signal frequency $F_{LO}$. An output frequency $f_{REF}$ of the mixer 22 is given by $f_{REF}=f_{LO}-f_{RF}$. Since the output frequency $f_{REF}$ of the mixer 22 is equal to the frequency $f_{IF}$ when the PLL is in the lock state, the input signal frequency $f_{IF}$ is converted into the output frequency $f_{RF}=f_{LO}-f_{IF}$ of the VCO 20.

As other examples of the PLL system for the frequency conversion, U.K. Patent No. GB 2 261 345 and U.S. Pat. No. 5,313,173 may be referred to. These references also use the same method as the fundamental principle of the PLL circuit.

In the above-described circuit, the output signal of the phase compactor is directly supplied to the low pass filter. Accordingly, in order to obtain a shorter settling time, it is necessary to broaden the frequency bandwidth of the PLL. On the other hand, however, when the frequency bandwidth is broadened, there is a problem that output noise is increased. Further, the circuit described in Chapter 10.3 of "PHASELOCK TECHNIQUES" (ISBN 0-471-14294-3) published by John Wiley & Sons is not considered to be used in a portable terminal.

FIG. 11 illustrates an example of circuit configuration for shortening the settling time when a voltage output type phase comparator is used. The PLL circuit includes the voltage output type phase comparator 23, a voltage controlled oscillator (VCO) 24, a coupler 25, a mixer 26, a reset switch 27, a power supply 28 for use in shortening of a settling time and a low passfilter 29. Usually, in the PLL circuit, the low pass filter, the VCO and the coupler are mounted externally to the PLL circuit. In this example, since the reset switch 27 and the power supply 28 are connected to the low pass filter 29, the reset switch 27 and the power supply 28 are also mounted externally to the PLL circuit.

While the PLL operation is performed, the reset switch 27 is open (off state). When the PLL circuit is in the phase-locked state, the VCO 24 produces an output signal having a fixed frequency as a center frequency. A small radio communication apparatus such as a portable telephone mostly performs transmission in the time division manner. In this operation, a transmission period in which the PLL circuit is locked to perform transmission with the fixed center frequency and a transmission stop period in which the PLL operation is canceled after the transmission period are performed repeatedly. Further, there is a communication system in which the transmission frequency is changed at a certain period. In such a case, the PLL is locked to the same or different frequency after a predetermined period from cancellation of the locked state. For this end, a voltage for resetting the PLL operation is supplied to the VCO. The reset switch 27 is provided in order to apply the reset voltage. When the reset switch 27 is closed (on state), an input potential of the VCO 24 becomes 0 volts and the output frequency becomes a minimum oscillation frequency.

The voltage output type phase comparator 23 requires an operational amplifier 272 for converting a voltage output into a current output in order to supply a current to a low pass filter 271. The operational amplifier 272 is necessarily required to adjust its operation characteristic and accordingly it is difficult to fabricate the operational amplifier into an IC chip. The negative DC voltage power supply 28 applies a negative bias voltage to an inverted input of the operational amplifier 272 to thereby shorten the settling time of the PLL. Since it is difficult to generate this negative voltage within the IC chip, the circuit of the negative voltage power supply 28 must be disposed outside the IC chip.

SUMMARY OF THE INVENTION

A phase-locked loop (PLL) circuit according to the present invention employs a phase comparator of current output type. By using the current output type phase comparator in the PLL circuit, it is not required to use an operational amplifier in a low pass filter (LPF). The PLL circuit including the current output type phase comparator, the LPF and a reset switch can be fabricated within an IC chip. Further, when a current source for supplying a current to the LPF is used together with the current output type phase comparator, a time from the start of control of the PLL to the locked state, that is, the settling time can be shortened. The PLL circuit according to the present invention realizes the compatibility of the short settling time or increased settling speed and low output noise without broadening of the band of the PLL.

Furthermore, the radio communication apparatus according to the present invention includes a transmission unit having the PLL circuit using the current output type phase comparator.

In the PLL circuit of the present invention, since an operational amplifier is not required in the LPF and the reset switch is fabricated in an IC chip, reliability and productivity of the PLL can be improved and the radio communication apparatus can be made small.

DESCRIPTION OF THE PREFERRED EMBODIMENTS

Figure 12:
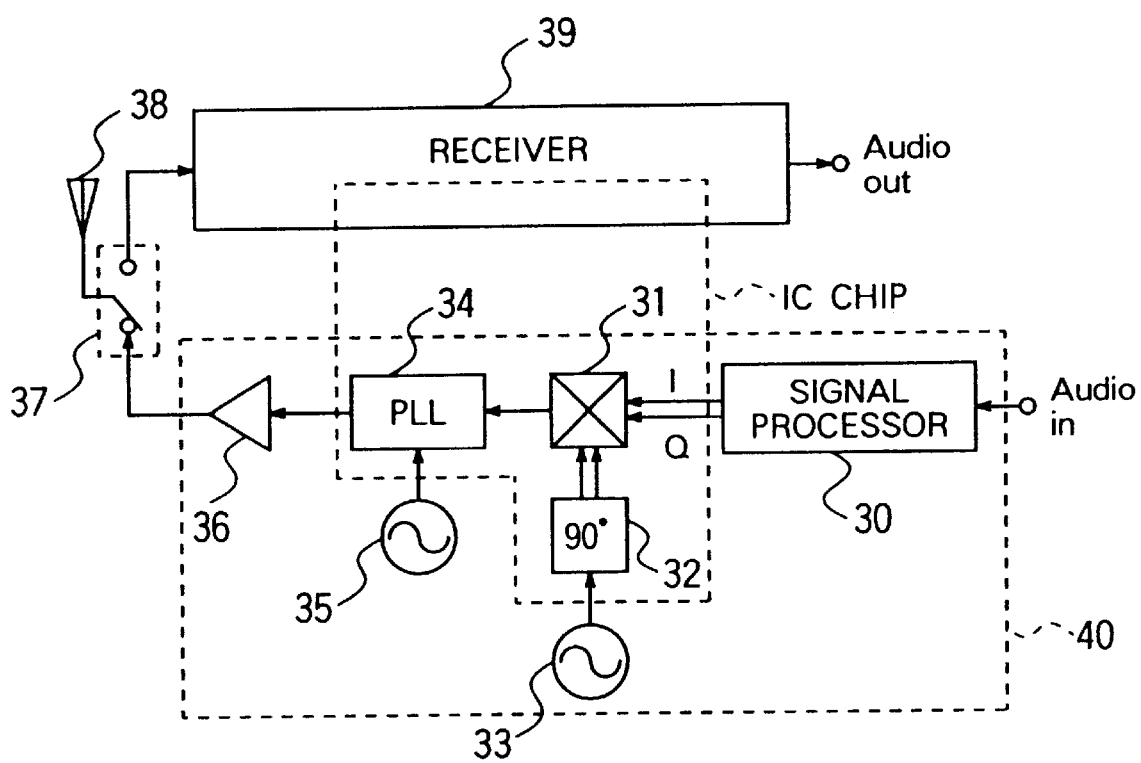
FIG. 12 is a block diagram illustrating an example of a radio communication terminal apparatus using the PLL circuit of the present invention.

A PLL circuit according to an embodiment of the present invention can be used in a transmitter of a radio communication terminal apparatus such as a portable telephone. FIG. 12 is a block diagram illustrating an example of a radio communication terminal apparatus including the PLL circuit according to the embodiment of the present invention. The communication terminal apparatus can use in various communication systems such as GSM (Global System for Mobile Communications), PDC (Personal Digital Cellular), PCN (Personal Communication Network) and PHS (Personal Handyphone System).

A voice produced by a user is converted into an electric audio signal "Audio in" by means of a microphone (not shown) and is inputted to an input terminal of a transmitter 40.

The audio signal "Audio in" is converted by a digital signal processor 30 into I- and Q-channel signals having phases shifted from each other by 90 degrees. The I- and Q-channel signals are then modulated in a modulation mixer 31 and are converted into an IF band frequency. A local oscillation signal is generated by a local signal generator 33 and is phase-shifted by 90 degrees by a 90-degree distributor 32 to be supplied to the modulation mixer 31. Thereafter, the signal produced by the mixer 31 is converted by a PLL circuit 34 of the present invention into a transmission band frequency. A local oscillation signal supplied to the PLL circuit 34 is generated by a local signal generator 35. An output signal of the PLL circuit 34 is amplified by an output amplifier 36 and then transmitted from an antenna 38 through a switch 37, which is connected to the antenna 38; to the transmitter 40 including the processor 30, the mixer 31, the 90-degree distributor 32, the local signal oscillator 33, the PLL 34, the local signal oscillator 35 and the amplifier 36; and to a receiver 39.

The circuit portion including the mixer 31, the 90-degree distributor 32, the PLL 34 and a part of the receiver 39 in an area surrounded by broken line of FIG. 12 can be fabricated in a single IC chip.

Referring now to FIGS. 1 to 9, the structure and operation of the PLL circuit according to the embodiment of the present invention are described.

Figure 1:
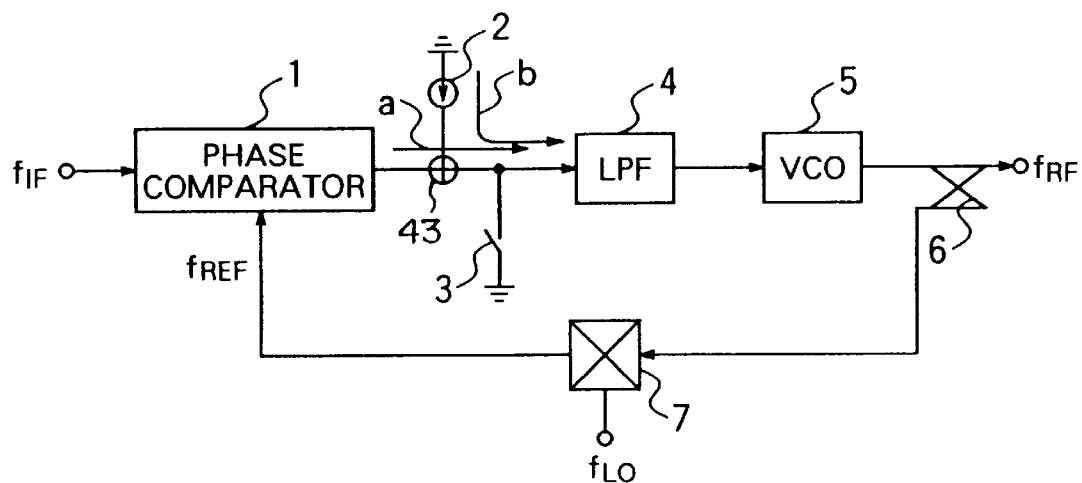
FIG. 1 is a block diagram illustrating an embodiment of a PLL circuit according to the present invention.

FIG. 1 illustrates a basic configuration of a PLL circuit according to the embodiment of the present invention. The PLL circuit includes a current output type phase comparator 1, a constant current source 2, a reset switch 3, a low pass filter 4, a VCO 5, a coupler 6 and a mixer 7. The constant current source 2 supplies a constant current (shown by arrow b) from the ground toward an input terminal of the low pass filter 4. The reset switch 3 is connected between the input terminal of the low pass filter 4 and the ground. The reset switch 3 is open during operation of the PLL circuit.

The current output type phase comparator 1 comparesa phase of an input signal frequency $f_{IF}$ with a phase of a reference signal frequency $f_{REF}$ and produces a current proportional to a phase difference thereof. When the PLL circuit is operated, the reset switch 3 is open. In order to shorten the settling time of the PLL, the output current (shown by arrow a) of the phase comparator 1 is added to the constant current (shown by arrow b) produced from the constant current source 2 in an adder 43 and a sum current thereof is supplied to the low pass filter 4. Incidentally, the adder 43 is merely signal lines combined with each other. When the current output type phase comparator 1 is operated by itself and the phase difference of the two input signals $f_{IF}$ and $f_{REF}$ is varied, the condition for causing the PLL to perform the stable settling operation is obtained experimentally and is given by the following equation (1):

$$\frac{0.5(I_{MAX} - |I_{MIN}|) + I_{OFF}}{I_{MAX}} \leq 0.6 \qquad (1)$$

where the maximum value and the minimum value of the DC component of the output current are $I_{MAX}$ and $I_{MIN}$, respectively, and the output current of the constant current source 2 is $I_{OFF}$.

The low pass filter 4 removes unnecessary harmonic components and noise from the sum current of the outputs of the current output type phase comparator 1 and the constant current source 2 and converts the sum current into a voltage signal to be supplied to the VCO 5. The output frequency $f_{RF}$ of the VCO 5 is inputted through the coupler 6 to the mixer 7 to be mixed with the local oscillation signal frequency $f_{LO}$. The output frequency $f_{REF}$ of the mixer 7 is given by $f_{REF} f_{LO}-f_{RF}$ When the PLL is in the locked state, the output frequency $f_{REF}$ of the mixer 7 is equal to $f_{IF}$. Accordingly, the input signal frequency $f_{IF}$ is converted into $f_{RF}=f_{LO}-f_{IF}$.

Figure 2:
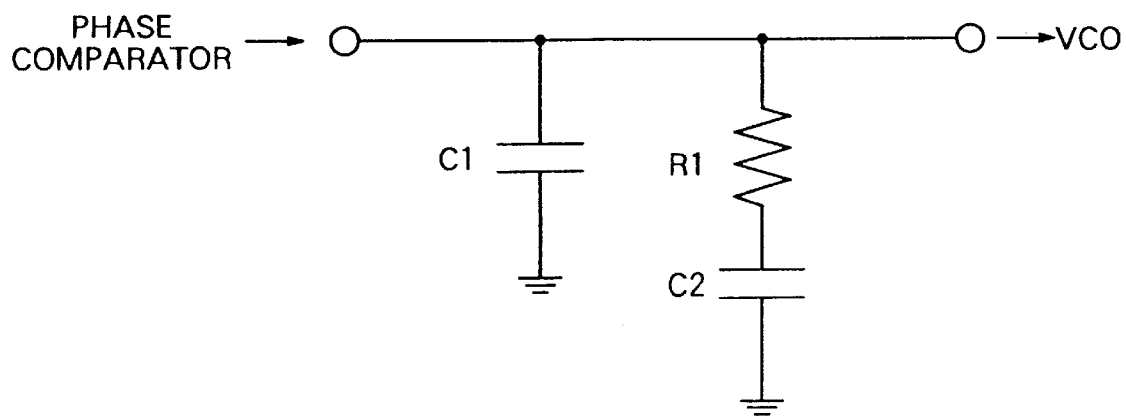
FIG. 2 illustrates a definite embodiment of a low pass filter used in the PLL circuit of the present invention.

FIG. 2 illustrates a definite circuit of an embodiment of the low pass filter 4. Electric charges are stored in the low pass filter 4 by a DC component of the output current of the current output type phase comparator 1. A charged voltage is supplied to the VCO 5 as the output voltage of the low pass filter 4. At the same time, electric charges are also stored in capacitors $C_1$ and $C_2$ of the low pass filter 4 by the constant current produced from the constant current source 2 and accordingly the speed of storing the electric charges is increased as compared with the case where the constant current source 2 is not provided. Consequently, the settling time of the PLL is shortened.

The current supplied from constant current source 2 to the low pass filter 4 may be controlled to be a predetermined constant current from the beginning or a considerable large current temporarily at the beginning and a slightly small constant current thereafter. In the latter case, the speed of storing the electric charges can be increased as compared with the former case.

The transfer function F(s) of the low pass filter 4 is given by the following equation (2):

$$F(s) = \frac{s + \frac{1}{C_2 R_1}}{C_1 s \left( S + \frac{C_1 + C_2}{C_1 C_2 R_1} \right)} \quad (2)$$

Operation of the PLL circuit is analyzed when the filter circuit shown in FIG. 2 is used as the low pass filter 4 of FIG. 1. When the phase difference conversion gain of the current output type phase comparator 1 is $K_d$ [A/rad] and the sensitivity of the VCO 5 is $K_v$ [rad/s/V], the open loop transfer function Ho(s) of the PLL is given by the following equation (3):

$$Ho = K_d F(s) \frac{K_v}{s} \quad (3)$$

$$= \frac{K_d K_v \left( s + \frac{1}{C_2 R_1} \right)}{C_1 s^2 \left( s + \frac{C_1 + C_2}{C_1 C_2 R_1} \right)}$$

At this time, a pole $\omega_z$ [rad/s] and a zero $\omega_F$ [rad/s] of the PLL are given by the following equations (4) and (5), respectively:

$$\omega_z = \frac{1}{C_2 R_1} \quad (4)$$

$$\omega_p = \frac{C_1 + C_2}{C_1 C_2 R_1} \quad (5)$$

Figure 3:
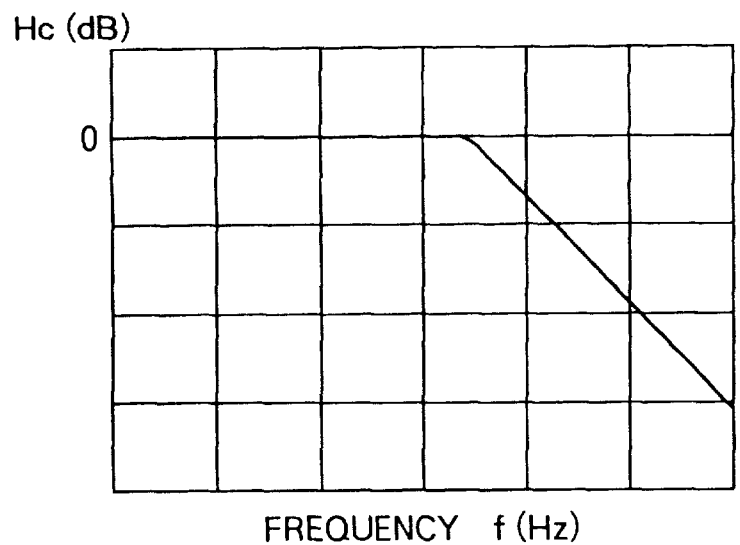
FIG. 3 is a diagram showing a definite example of a closed loop transfer function in the embodiment of the PLL circuit of the present invention.

FIG. 3 shows an example of a frequency characteristic of a closed loop transfer function Hc(s) of the PLL. As shown in FIG. 3, the loop shows the characteristic of the low pass filter. Accordingly, the frequency modulation and the phase modulation within the loop bandwidth can be reproduced at the output of the VCO and unnecessary signals beyond the bandwidth can be suppressed. However, when the loop bandwidth is made too narrow, the modulation accuracy at the output of the PLL is deteriorated and when the loop bandwidth is made too broad, it is insufficient to suppress noise beyond the bandwidth. In order to satisfy the standard such as GSM, it is necessary to select the loop bandwidth from the range of 1 MHz to 3 MHz.

Figure 4:
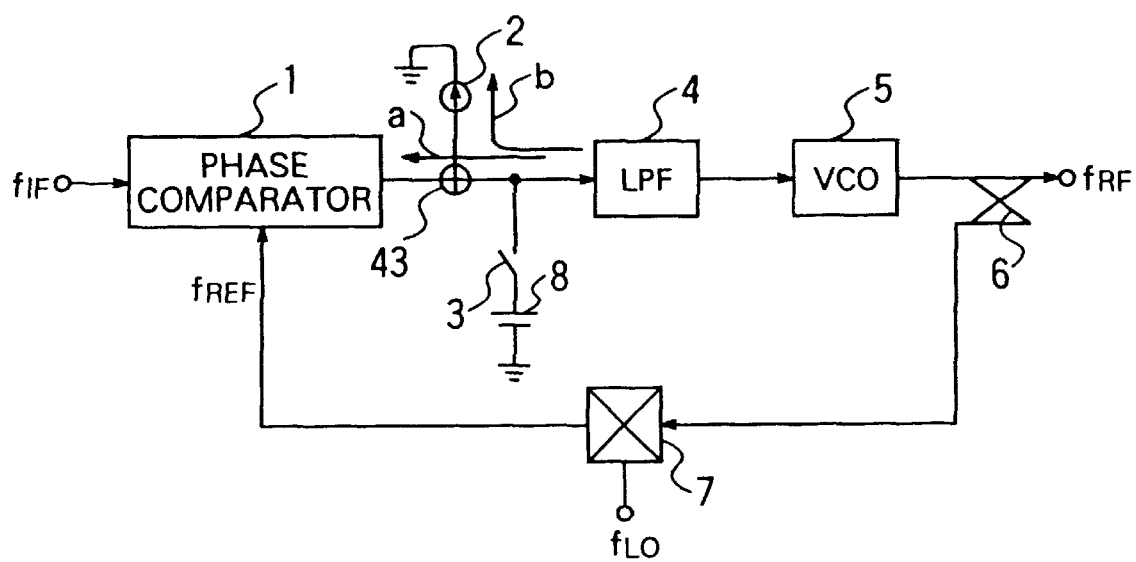
FIG. 4 is a block diagram illustrating another embodiment of a PLL circuit according to the present invention.

FIG. 4 illustrates a PLL circuit according to another embodiment of the present invention. The PLL circuit includes a current output type phase comparator 1, a constant current source 2, a reset switch 3, a low pass filter 4, a VCO 5, a coupler 6, a mixer 7 and a power supply 8. The constant current source 2 produces a constant current (shown by arrow b) flowing from an input terminal of the low pass filter 4 to the ground. The reset switch 3 is connected between the input terminal of the low pass filter 4 and the power supply 8.

The current output type phase comparator 1 compares a phase of an input signal frequency $f_{IF}$ with a phase of a reference signal frequency $f_{REF}$ and produces a current proportional to a phase difference thereof. When the PLL circuit is operated, the reset switch 3 is open. In order to shorten the settling time of the PLL circuit, the constant current (arrow b) produced from the constant current source 2 is added to an output current (arrow a) of the current output type phase comparator 1 and a sum current thereof is supplied to the low pass filter 4.

Operation of the PLL circuit of FIG. 4 in which the low pass filter 4 shown in FIG. 2 is used is now described. When the reset switch 3 is closed to perform the reset operation, the capacitors $C_1$ and $C_2$ of the low pass filter 4 are charged by a positive voltage of the power supply 8. The voltage of the power supply 8 is set to a value higher than an input voltage of the VCO 5 at the time when the PLL circuit has completed the settling operation (upon the locked state). When the reset switch 3 is opened and the PLL operation is started, the electric charges stored in the capacitors $C_1$ and $C_2$ are discharged toward the constant current source 2 and the phase comparator 1. The constant current source 2 facilitates the discharge of positive electric charges from the capacitors $C_1$ and $C_2$. Consequently, the settling time of the PLL circuit is shortened.

When the current output type phase comparator 1 is operated by itself and the phase difference of the two input signals is varied, the condition for causing the PLL to perform the stable settling operation is obtained experimentally and is given by the following equation (6):

$$\frac{0.5(|I_{MIN}| - I_{MAX}) + I_{OFF}}{|I_{MIN}|} \leq 0.6 \quad (6)$$

where the maximum value and the minimum value of the DC component of the output current are $I_{MAX}$ and $I_{MIN}$, respectively, and the output current of the constant current source 2 flowing from the input terminal of the low pass filter 4 to the ground is $I_{OFF}$.

The low pass filter 4 removes unnecessary harmonic components and noise from the sum current of the outputs of the current output type phase comparator 1 and the constant current source 2 and converts the sum current into a voltage signal to be supplied to the VCO 5. The output frequency $f_{RF}$ of the VCO 5 is inputted through the coupler 6 to the mixer 7 to be mixed with the local oscillation signal frequency $f_{LO}$. The output frequency $f_{REF}$ of the mixer 7 is given by $f_{REF} = f_{LO} - f_{RF}$. When the PLL is in the locked state, the output frequency $f_{REF}$ of the mixer 7 is equal to $f_{IF}$. Accordingly, the input signal frequency $f_{IF}$ is converted into $f_{RF} = f_{LO} - f_{IF}$.

Figure 5:
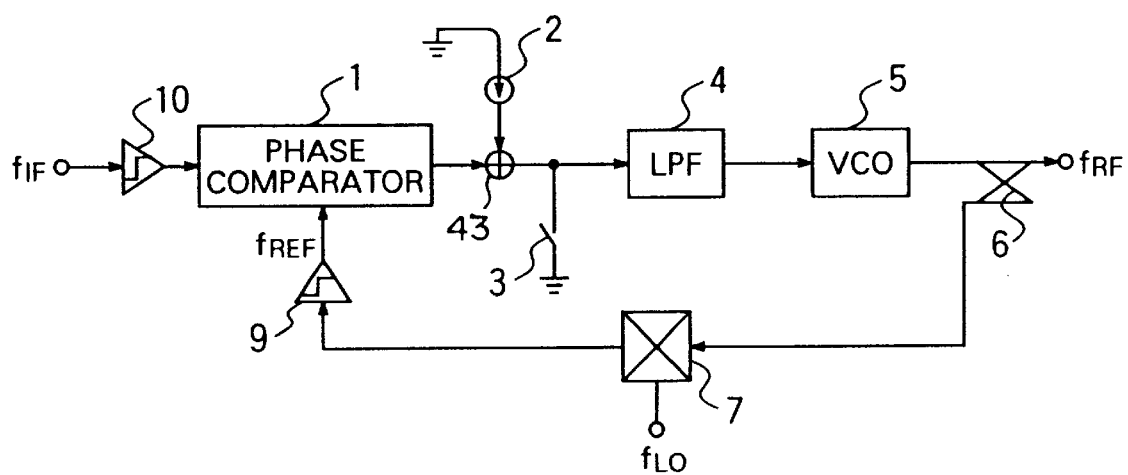
FIG. 5 is a block diagram illustrating another embodiment of a PLL circuit according to the present invention.

FIG. 5 illustrates another embodiment of the present invention. The PLL circuit of FIG. 5 is characterized in that limiters 9 and 10 are connected to the input portions of the current output type phase comparator 1 in the same configuration of the PLL circuit of FIG. 1. When a mixer type circuit using bipolar transistors is employed in the current output type phase comparator 1 and an amplitude of an input signal is smaller than kT/q where q is an amount of electric charges of electrons, k is Boltzmann's constant, and T is an absolute temperature, the phase difference conversion gain of the current output type phase comparator 1 has the dependency on the input amplitude. The limiters 9 and 10 amplify the input signals to the current output type phase comparator 1 to increase the amplitude of the input signal $f_{RF}$ to a constant amplitude larger than kT/q, so that the phase difference conversion gain of the phase comparator 1 can be made constant.

Figure 6:
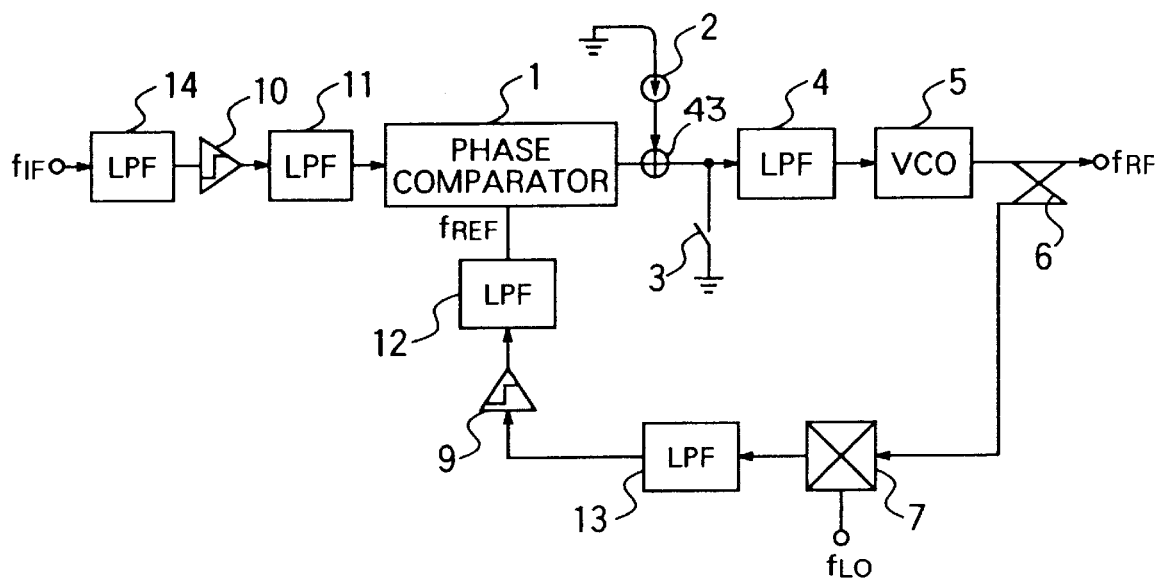
FIG. 6 is a block diagram illustrating still another embodiment of a PLL circuit according to the present invention.

FIG. 6 illustrates another embodiment of the present invention. The PLL circuit of FIG. 6 is characterized in that low pass filters 11, 12, 13 and 14 are connected in the same configuration as the PLL circuit of FIG. 5. The low pass filters 13 and 14 are used to prevent unnecessary harmonics from being inputted to the limiters 9 and 10. Since the limiters 9 and 10 produce the signals having the constant amplitude, the output signals of the limiters 9 and 10 contain unnecessary harmonic components. Accordingly, the low pass filters 11 and 12 removes the unnecessary harmonic components.

Figure 7:
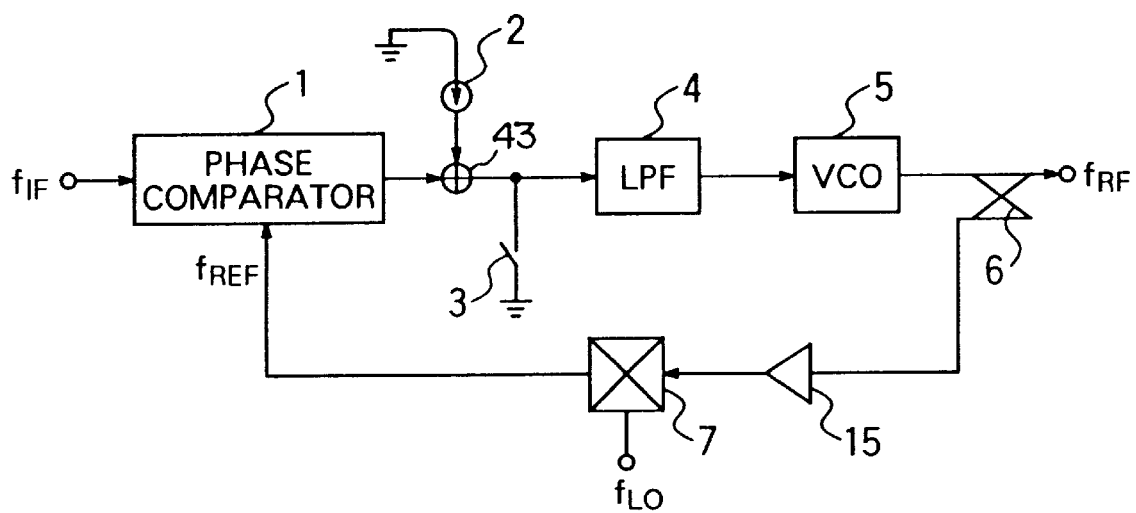
FIG. 7 is a block diagram illustrating still another embodiment of a PLL circuit according to present invention.

FIG. 7 illustrates another embodiment of a PLL circuit according to the present invention. The PLL circuit of FIG. 7 is characterized in that an amplifier 15 is connected between the coupler 6 and the mixer 7 in the same configuration as the PLL circuit of FIG. 1. By connecting the amplifier 15, the PLL circuit can be operated even when the output of the VCO has a small amplitude.

Figure 8:
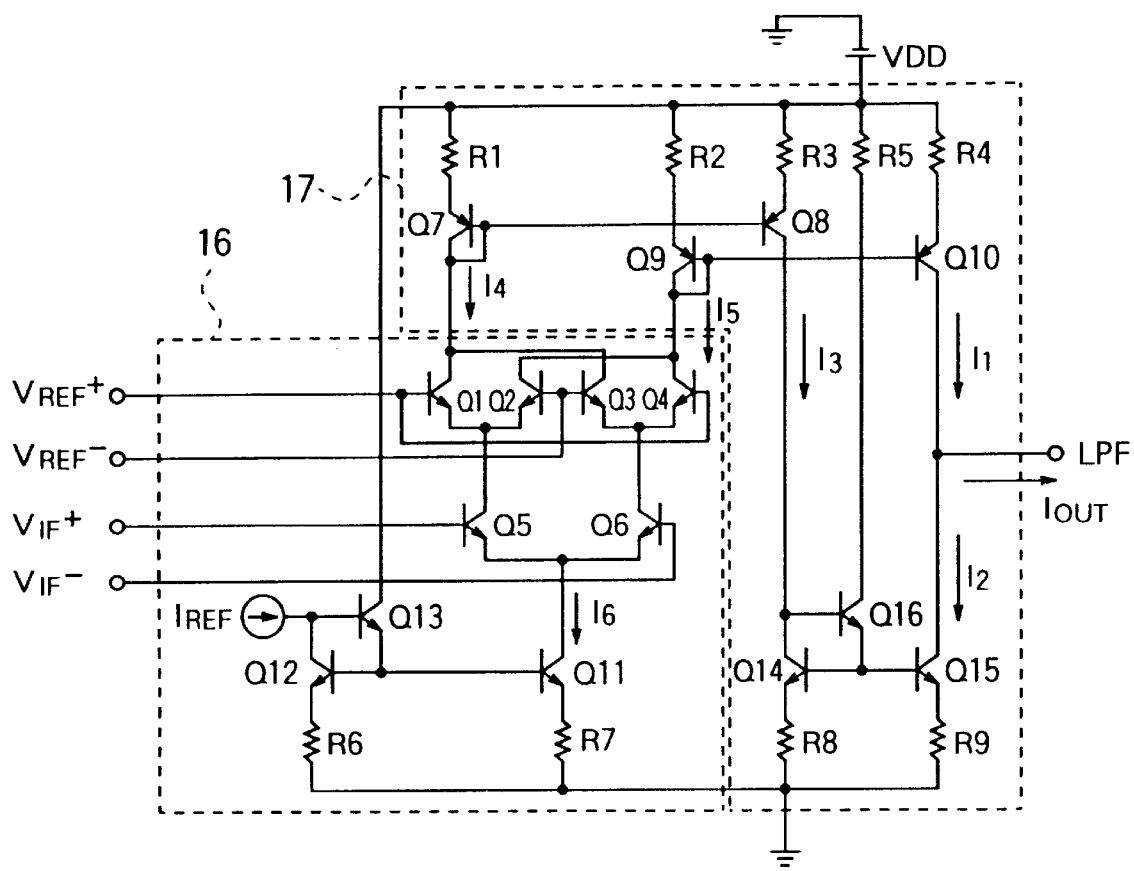
FIG. 8 is a circuit diagram illustrating a definite embodiment of a current output type phase comparator used in the PLL circuit according to the present invention.

FIG. 8 illustrates an embodiment of the current output type phase comparator 1. Transistors may be of bipolar type. VDD is a power supply voltage. Numeral 16 denotes a so-called Gilbert multiplier. Detail thereof is described in Chapter 10.3 of "DESIGN TECHNIQUE OF ANALOG INTEGRATED CIRCUIT FOR SUPER LSI" (Last Volume) issued by Baifukan. The Gilbert multiplier 16 mixes input signals $V_{IF}^+$ and $V_{IF}^-$ and reference signals $V_{REF}^+$ and $V_{REF}^-$ to produce differential currents $I_4$ and $I_5$ having phases opposite to each other. Bases of transistors Q2 and Q3 are applied with the signal $V_{REF}^-$ having the phase opposite to that of the signal applied to bases of transistors Q1 and Q4. Similarly, a base of a transistor Q6 is applied with the signal $V_{IF}^-$ having the phase opposite to that of the signal applied to a base of a transistor Q5. When amplitudes of the input signals $V_{IF}^+$ and $V_{IF}^-$ and the reference signals $V_{REF}^+$ and $V_{REF}^-$ are larger than kT/q and a collector current of a transistor Q11 is $I_6$, the relation of a phase difference $\phi$ of the input signals $V_{IF}^+$ and $V_{IF}^-$ and the reference signals $V_{REF}^+$ and $V_{REF}^-$ and a differential current $I_4$–$I_5$ produced by the Gilbert multiplier 16 is given by the following equation (7):

$$I_4 - I_5 = I_6\left(\frac{2\phi}{\pi} - 1\right) \quad (7)$$

Transistors Q11, Q12 and Q13, resistors R6 and R7 and a constant current source $I_{REF}$ constitute a bias circuit of the Gilbert multiplier 16 using the current mirror circuit. The transistor Q11 constitutes a current source for the transistors Q5 and Q6 connected to the collector of the transistor Q11.

Numeral 17 denotes a charge pump circuit which converts the output differential currents $I_4$ and $I_5$ of the Gilbert multiplier 16 into a single-ended output signal to produce it as a current $I_{out}$. Transistors Q7 and Q8 and resistors R1 and R3 constitute a current mirror circuit. When a current mirror ratio determined by characteristics of the resistors R1 and R3 and the transistors Q7 and Q8 is a, the relation of $I_3=a \cdot I_4$ is obtained. Similarly, transistors Q9 and Q10 and resistors R2 and R4 constitute a current mirror circuit. When a current mirror ratio thereof is b, the relation of $I_1=b \cdot I_5$ is obtained. Further, transistors Q14, Q15 and Q16 and resistors R8 and R9 also constitute a current mirror circuit. When a current mirror ratio thereof is c, the relation of $I_2=c \cdot I_3$ is obtained. The currents $I_1$ and $I_2$ are used to obtain $I_{OUT}=I_1-I_2$.

Figure 9:
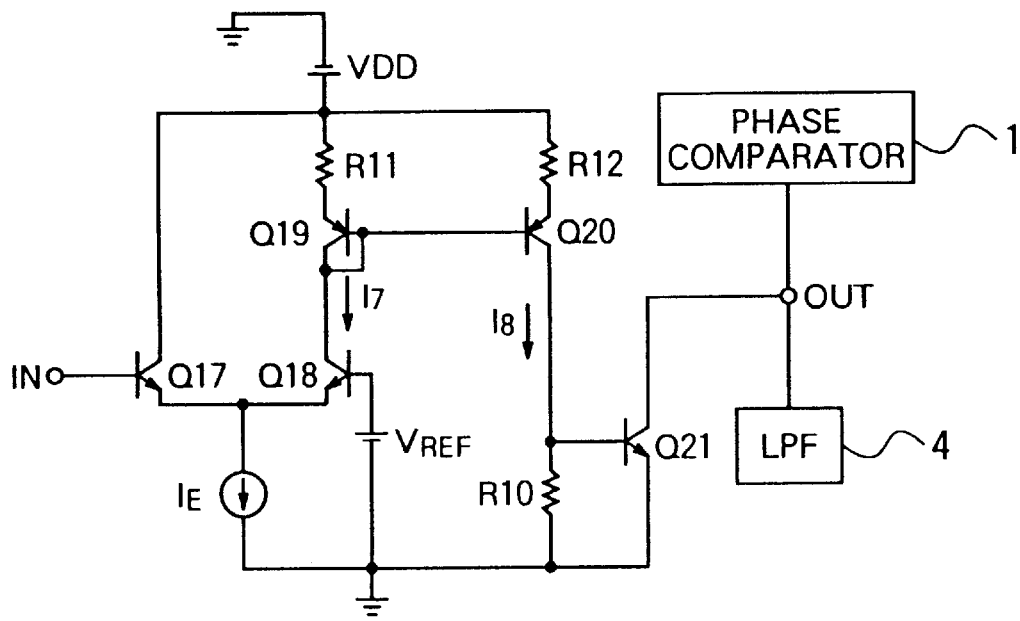
FIG. 9 is a circuit diagram illustrating a definite embodiment of a reset switch used in the PLL circuit of the present invention.
Figure 10:
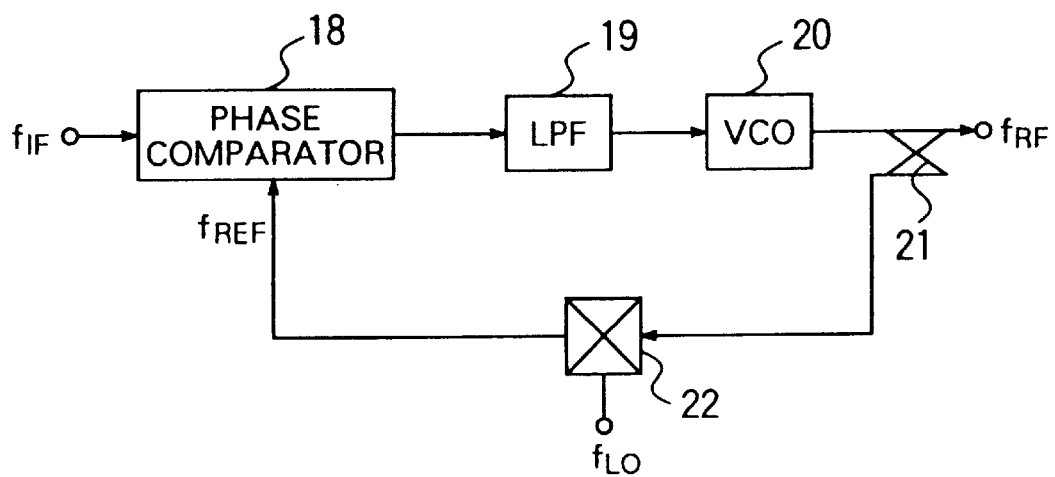
FIG. 10 is a block diagram illustrating a general configuration of a PLL circuit.
Figure 11:
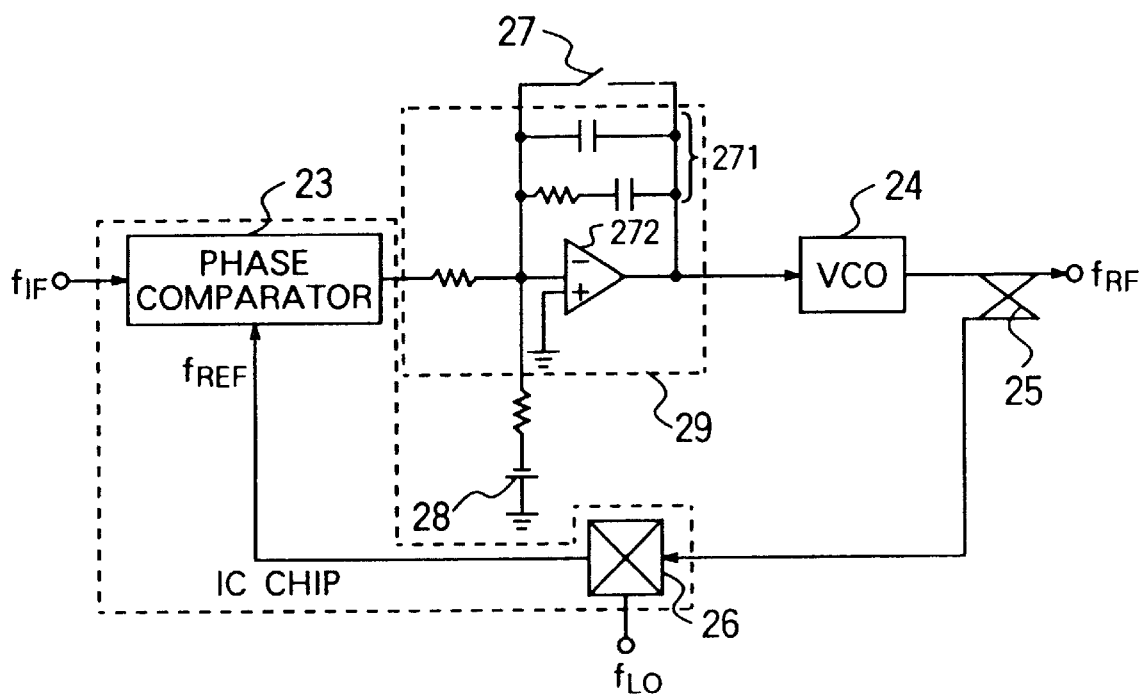
FIG. 11 is a block diagram illustrating a PLL circuit using a voltage output type phase comparator.

FIG. 9 illustrates an embodiment of the reset switch. That is, the reset switch corresponds to the reset switch 3 of FIG. 1. Transistors of bipolar type are used.

VDD is a power supply voltage. A constant current source $I_E$ is a bias circuit for the reset switch 3 and supplies a bias current to transistors Q17 and Q18. Transistors Q19 and Q20 and resistors R11 and R12 constitute a current mirror circuit and when a current mirror ratio thereof is d, the relation of $I_8=d \cdot I_7$ is obtained. When a voltage applied to an input terminal IN for control of the time division operation is larger than the reference voltage $V_{REF}$, a transistor Q18 is turned off, so that currents $I_7$ and $I_8$ scarcely flow and transistors Q19 and Q20 are also turned off. When a base current of the transistor Q21 is neglected since the base current is small, a base voltage of a transistor Q21 is given by $R10 \cdot I_8$, while since the current $I_8$ scarcely flows, the transistor Q21 is turned off, so that a collector current of the transistor Q21 hardly flows. Accordingly, the reset switch 3 becomes the off (open) state. When the voltage applied to the input terminal is smaller than the reference voltage VREF, the transistor Q18 is turned on and the current $I_8$ is $I_8=d \cdot I_7 \sim d \cdot I_E$. Accordingly, the base voltage of the transistor Q21 is substantially equal to $R10 \cdot d \cdot I_E$. When the current $I_E$ is set so that the transistor Q21 is turned on when the base voltage is equal to $R10 \cdot d \cdot I_E$, the transistor Q21 is turned on, so that a terminal OUT is connected to the ground and the reset switch 3 becomes the on (closed) state.

The circuits shown in FIGS. 8 and 9 employ bipolar transistors, but transistors of other kinds such as, for example, MOSFET and MESFET may be used to realize the same function.

Figure 13:
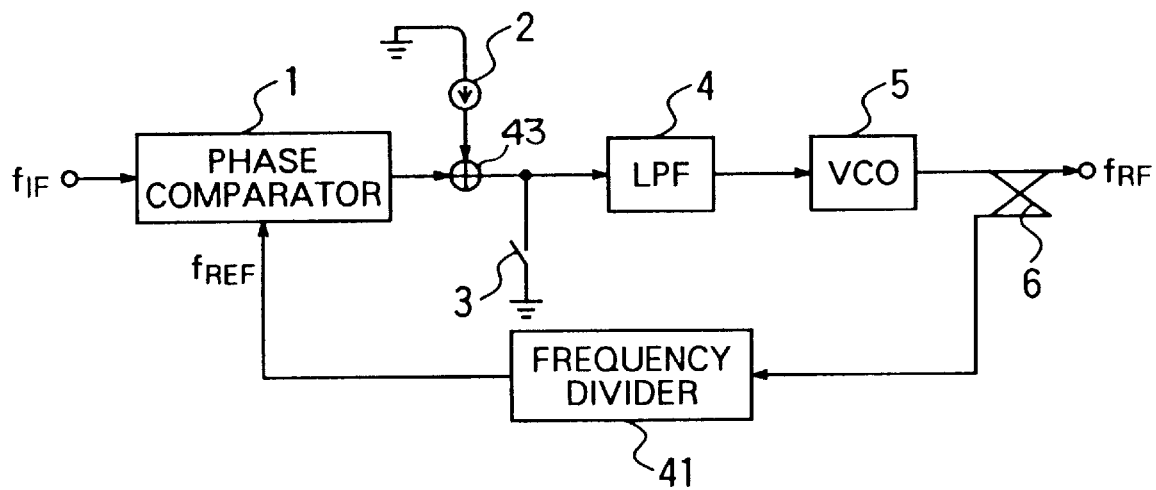
FIG. 13 is a block diagram illustrating a PLL circuit of still another embodiment according to the present invention.

FIG. 13 illustrates a PLL circuit according to another embodiment of the present invention. The PLL circuit of FIG. 13 is characterized in that a frequency divider 41 is connected between the current output type phase comparator 1 and the coupler 6 instead of the mixer 7 in the same configuration as the PLL circuit of FIG. 1. A frequency division ratio of the frequency divider 41 is given by $f_{RF}/f_{IF}$.

Figure 14:
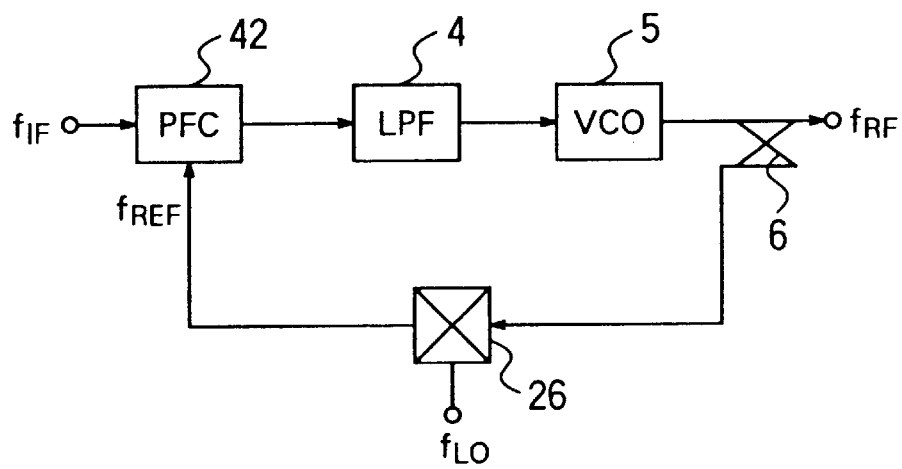
FIG. 14 is a block diagram illustrating a PLL circuit of still another embodiment according to the present invention.

FIG. 14 illustrates a PLL circuit according to still another embodiment of the present invention. The PLL circuit includes a current output type phase frequency comparator 42, a low pass filter 4, a VCO 5, a coupler 6 and a mixer 26. When the phase difference between the input signal $f_{IF}$ and the reference signal frequency $f_{REF}$ is small, the current output type phase frequency comparator 42 compares a phase of the input signal $f_{IF}$ with a phase of the reference signal frequency $f_{REF}$ and produces an error output current. When the phase difference between the input signal $f_{IF}$ and the reference signal frequency $f_{REF}$ is not small, the current output type phase frequency comparator 42 compares a frequency of the input signal $f_{IF}$ with a frequency of the reference signal frequency $f_{REF}$ and produces an error output current. The low pass filter 4 removes unnecessary harmonic components and noise from the output current of the comparator 42 and converts the output current into a voltage to be supplied to the VCO 5. An output frequency $f_{RF}$ of the VCO 5 is inputted to the mixer 26 through the coupler 6 and is mixed with the local oscillation signal frequency $f_{LO}$ in the mixer 26. An output frequency $f_{REF}$ of the mixer 26 is equal to $f_{IF}$ when the PLL circuit is in the locked state. Accordingly, the input signal frequency $f_{IF}$ is converted into $f_{RF}=f_{LO}-f_{IF}$.

The phase comparator is named a phase frequency comparator (PFC). Since the PLL circuit is necessarily locked without the provision of a switch when the PFC is used, the reset switch is not required. However, since the output voltage of the phase comparator is not once reduced to 0 volt by means of the reset switch, the PLL circuit may be operated even if the constant current source for increasing the settling speed is provided, while the settling time is not necessarily shortened.

As described above, according to the present invention, since the phase comparator produces the current output and the constant current is further added to the current output, the setting time can be shortened without widening the bandwidth for the PLL circuit. Furthermore, since the settling time shortening circuit and the reset switch are connected to the phase comparator, the circuit configuration suitable for the integrated circuit can be realized.

What is claimed is:

1. A radio communication apparatus comprising:

an antenna;

a transmitter having an output;

a receiver having an input; and a duplexer which selectively couples either of the input of the receiver and the output of the transmitter to the antenna;

wherein the transmitter includes:

a phase-locked loop circuit which receives a first signal having a frequency and converts the first signal into an output signal having a transmission frequency; and an output amplifier which amplifies the output signal of the phase-locked loop circuit to produce an output signal of the transmitter and supplies the output signal of the transmitter to the output of the transmitter; and wherein the phase-locked loop circuit includes:

a current output type phase comparator which converts a phase difference between the first signal and a second signal into a current signal;

a low pass filter which filters the current signal of the current output type phase comparator to produce an output signal; and a current source which supplies a current to an input of the low pass filter.

2. A radio communication apparatus according to claim 1, wherein the current output type phase comparator satisfies one of the following equations:

$$(0.5(I_{MAX}-|I_{MIN}|)+I_{OFF})/I_{MAX} \leq 0.6$$

$$(0.5(|I_{MIN}|-I_{MAX})+I_{OFF})/|I_{MIN}| \leq 6$$

where $I_{max}$ and $I_{MIN}$ are respectively a maximum value and a minimum value of a DC component of the current signal of the current output type phase comparator, and $I_{OFF}$ is a value of an output current of the current source.

3. A radio communication apparatus comprising:

an antenna;

a transmitter having an output;

a receiver having an input; and a duplexer which selectively couples either of the input of the receiver and the output of the transmitter to the antenna;

wherein the transmitter includes:

a phase-locked loop circuit which receives a first signal having a frequency and converts the first signal into an output signal having a transmission frequency; and an output amplifier which amplifies the output signal of the phase-locked loop circuit to produce an output signal of the transmitter and supplies the output signal of the transmitter to the output of the transmitter; and wherein the phase-locked loop circuit includes:

a current output type phase comparator which converts a phase difference between the first signal and a second signal into a current signal;

a low pass filter which filters the current signal of the current output type phase comparator to produce an output signal;

a voltage controlled oscillator which produces an output signal having a transmission frequency corresponding to the output signal of the low pass filter, the output signal of the voltage controlled oscillator constituting the output signal of the phase-locked loop circuit;

a frequency converter which frequency-converts the output signal of the voltage controlled oscillator to produce the second signal; and a current source which supplies a current to an input of the low pass filter.

4. A radio communication apparatus according to claim 3, wherein the current output type phase comparator satisfies the following equation:

$$(0.5(I_{MAX}-|I_{MIN}|)+I_{OFF})/I_{MAX} \leq 0.6$$

where $I_{MAX}$ and $I_{MIN}$ are respectively a maximum value and a minimum value of a DC component of the current signal of the current output type phase comparator, and $I_{OFF}$ is a value of an output current of the current source flowing toward the input of the low pass filter.

5. A radio communication apparatus according to claim 4, wherein the phase-locked loop circuit further includes a reset switch which applies to the voltage controlled oscillator a reset voltage to cancel a phase-locked state of the phase-locked loop circuit.

6. A radio communication apparatus according to claim 4, wherein the phase-locked loop circuit further includes:

a first limiter which limits an amplitude of an input signal of the phase-locked loop circuit to a fixed amplitude to produce the first signal; and a second limiter which limits an amplitude of an output signal of the frequency converter to a fixed amplitude to produce the second signal.

7. A radio communication apparatus according to claim 4, wherein the current output type phase comparator includes:

a Gilbert multiplier which produces a first differential output current and a second differential output current based on the phase difference between the first signal and the second signal;

a first current mirror circuit which receives the first differential output current of the Gilbert multiplier and produces an output current;

a second current mirror circuit which receives the second differential output current of the Gilbert multiplier and produces an output current; and a third current mirror circuit which receives the output current of the second current mirror circuit and produces an output current; and wherein the current signal of the current output type phase comparator is a sum of the output current of the first current mirror circuit and the output current of the third current mirror circuit.

8. A radio communication apparatus according to claim 3, wherein the current output type phase comparator satisfies the following equation:

$$(0.5(|I_{MIN}|-I_{MAX})+I_{OFF})/|I_{MIN}| \leq 0.6$$

where $I_{MAX}$ and $I_{MIN}$ are respectively a maximum value and a minimum value of a DC component of the current signal of the current output type phase comparator, and $I_{OFF}$ is a value of an output current of the current source flowing out from the input of the low pass filter.

9. A radio communication apparatus according to claim 8, wherein the phase-locked loop circuit further includes a reset switch which applies to the voltage controlled oscillator a reset voltage to cancel a phase-locked state of the phase-locked loop circuit.

10. A radio communication apparatus according to claim 8, wherein the phase-locked loop circuit further includes:

a first limiter which limits an amplitude of an input signal of the phase-locked loop circuit to a fixed amplitude to produce the first signal; and a second limiter which limits an amplitude of an output signal of the frequency converter to a fixed amplitude to produce the second signal.

11. A radio communication apparatus according to claim 8, wherein the current output type phase comparator includes:

a Gilbert multiplier which produces a first differential output current and a second differential output current based on the phase difference between the first signal and the second signal;

a first current mirror circuit which receives the first differential output current of the Gilbert multiplier and produces an output current;

a second current mirror circuit which receives the second differential output current of the Gilbert multiplier and produces an output current; and a third current mirror circuit which receives the output current of the second current mirror circuit and produces an output current; and wherein the current signal of the current output type phase comparator is a sum of the output current of the first current mirror circuit and the output current of the third current mirror circuit.

12. A radio transmission apparatus comprising:

an antenna; and a transmitter having an output coupled to the antenna;

wherein the transmitter includes:

a phase-locked loop circuit which receives a first signal having a frequency and converts the first signal into an output signal having a transmission frequency; and an output amplifier which amplifies the output signal of the phase-locked loop circuit to produce an output signal of the transmitter and supplies the output signal of the transmitter to the output of the transmitter; and wherein the phase-locked loop circuit includes:

a current output type phase comparator which converts a phase difference between the first signal and a second signal into a current signal;

a low pass filter which filters the current signal of the current output type phase comparator to produce an output signal;

a voltage controlled oscillator which produces an output signal having a transmission frequency corresponding to the output signal of the low pass filter, the output signal of the voltage controlled oscillator constituting the output signal of the phase-locked loop circuit;

a frequency converter which frequency-converts the output signal of the voltage controlled oscillator to produce the second signal; and a current source which supplies a current to an input of the low pass filter.

13. A radio transmission apparatus according to claim 12, wherein the current output type phase comparator satisfies the following equation:

$$(0.5(I_{MAX}-|I_{MIN}|)+I_{OFF})/I_{MAX} \leq 0.6$$

where $I_{MAX}$ and $I_{MIN}$ are respectively a maximum value and a minimum value of a DC component of the current signal of the current output type phase comparator, and $I_{OFF}$ is a value of an output current of the current source flowing toward the input of the low pass filter.

14. A radio transmission apparatus according to claim 13, wherein the phase-locked loop circuit further includes a reset switch which applies to the voltage controlled oscillator a reset voltage to cancel a phase-locked state of the phase-locked loop circuit.

15. A radio transmission apparatus according to claim 13, wherein the phase-locked loop circuit further includes:

a first limiter which limits an amplitude of an input signal of the phase-locked loop circuit to a fixed amplitude to produce the first signal; and a second limiter which limits an amplitude of an output signal of the frequency converter to a fixed amplitude to produce the second signal.

16. A radio transmission apparatus according to claim 13, wherein the current output phase comparator includes:

a Gilbert multiplier which produces a first differential output current and a second differential output current based on the phase difference between the first signal and the second signal;

a first current mirror circuit which receives the first differential output current of the Gilbert multiplier and produces an output current;

a second current mirror circuit which receives the second differential output current of the Gilbert multiplier and produces an output current; and a third current mirror circuit which receives the output current of the second current mirror circuit and produces an output current; and wherein the current signal of the current output type phase comparator is a sum of the output current of the first current mirror circuit and the output current of the third current mirror circuit.

17. A radio transmission apparatus according to claim 12, wherein the current output type phase comparator satisfies the following equation:

$$(0.5(|I_{MIN}|-I_{MAX})+I_{OFF})/|I_{MIN}| \leq 0.6$$

where $I_{MAX}$ and $I_{MIN}$ are respectively a maximum value and a minimum value of a DC component of the current signal of the current output type phase comparator, and $I_{OFF}$ is a value of an output current of the current source flowing out from the input of the low pass filter.

18. A radio transmission apparatus according to claim 17, wherein the phase-locked loop circuit further includes a reset switch which applies to the voltage controlled oscillator a reset voltage to cancel a phase-locked state of the phase-locked loop circuit.

19. A radio transmission apparatus according to claim 17, wherein the phase-locked loop circuit further includes:

a first limiter which limits an amplitude of an input signal of the phase-locked loop circuit to a fixed amplitude to produce the first signal; and a second limiter which limits an amplitude of an output signal of the frequency converter to a fixed amplitude to produce the second signal.

20. A radio transmission apparatus according to claim 17, wherein the current output type phase comparator includes:

a Gilbert multiplier which produces a first differential output current and a second differential output current based on the phase difference between the first signal and the second signal;

a first current mirror circuit which receives the first differential output current of the Gilbert multiplier and produces an output current;

a second current mirror circuit which receives the second differential output current of the Gilbert multiplier and produces an output current; and a third current mirror circuit which receives the output current of the second current mirror circuit and produces an output current; and wherein the current signal of the current output type phase comparator is a sum of the output current of the first current mirror circuit and the output current of the third current mirror circuit.

* * * * *